(12) United States Patent
Ostholt et al.

(10) Patent No.: US 11,383,972 B2
(45) Date of Patent: Jul. 12, 2022

(54) METHOD FOR PRODUCING MICROSTRUCTURES

(71) Applicant: LPKF Laser & Electronics AG, Garbsen (DE)

(72) Inventors: Roman Ostholt, Langenhagen (DE); Norbert Ambrosius, Garbsen (DE)

(73) Assignee: LPKF LASER & ELECTRONICS AG, Garbsen (DE)

( * ) Notice: Subject to any disclaimer, the term of this patent is extended or adjusted under 35 U.S.C. 154(b) by 49 days.

(21) Appl. No.: 17/265,230

(22) PCT Filed: Jul. 31, 2019

(86) PCT No.: PCT/DE2019/100701
§ 371 (c)(1),
(2) Date: Feb. 2, 2021

(87) PCT Pub. No.: WO2020/030222
PCT Pub. Date: Feb. 13, 2020

(65) Prior Publication Data
US 2021/0347637 A1    Nov. 11, 2021

(30) Foreign Application Priority Data

Aug. 9, 2018 (DE) ...................... 10 2018 119 405.6
Mar. 20, 2019 (DE) ...................... 10 2019 107 114.3

(51) Int. Cl.
*B81C 1/00* (2006.01)
(52) U.S. Cl.
CPC .. *B81C 1/00158* (2013.01); *B81C 2201/0133* (2013.01); *B81C 2201/0143* (2013.01)

(58) Field of Classification Search
CPC .................................................. B81C 1/00158
See application file for complete search history.

(56) References Cited

U.S. PATENT DOCUMENTS

| 4,236,137 A | 11/1980 | Kurtz et al. |
| 5,178,016 A | 1/1993 | Dauenhauer et al. |
| 6,093,579 A | 7/2000 | Sathe |

(Continued)

FOREIGN PATENT DOCUMENTS

| DE | 102011085353 A1 | 5/2012 |
| DE | 102017216418 A1 | 4/2018 |

*Primary Examiner* — Moazzam Hossain
(74) *Attorney, Agent, or Firm* — Leydig, Voit & Mayer, Ltd.

(57) ABSTRACT

A method for producing a microstructure in a substrate with a membrane-like bridging or overhanging surface includes modifying the substrate, which is made of glass, by laser radiation along a peripheral contour. A membrane layer is applied over a surface of the substrate for producing the bridging or overhanging surface, wherein, at least in partial surfaces enclosing the peripheral contour of the laser modifications, a sacrificial layer is disposed between the substrate and the membrane layer. A side of the substrate facing away from the membrane layer is exposed to an etching attack such that material is removed primarily along the peripheral contour until the sacrificial layer is reached and there is a disintegration or reduction of the sacrificial layer and a separation of a connection of a part of the substrate enclosed by the peripheral contour from the surrounding substrate and from the membrane layer.

16 Claims, 3 Drawing Sheets

(56) References Cited

U.S. PATENT DOCUMENTS

| | | | |
|---|---|---|---|
| 6,188,467 B1* | 2/2001 | Yamatsu | G03F 7/7075 198/394 |
| 2002/0135708 A1* | 9/2002 | Murden | H04R 17/02 349/19 |
| 2012/0107994 A1 | 5/2012 | Kanamori et al. | |
| 2016/0088414 A1 | 3/2016 | Zheng et al. | |
| 2018/0086624 A1* | 3/2018 | Cheng | B81B 3/007 |
| 2018/0093881 A1 | 4/2018 | Chen et al. | |

\* cited by examiner

METHOD FOR PRODUCING MICROSTRUCTURES

CROSS-REFERENCE TO PRIOR APPLICATIONS

This application is a U.S. National Phase Application under 35 U.S.C. § 371 of International Application No. PCT/DE2019/100701, filed on Jul. 31, 2019, and claims benefit to German Patent Application Nos. DE 10 2018 119 405.6, filed on Aug. 9, 2018, and DE 10 2019 107 114.3, filed on Mar. 20, 2019. The International Application was published in German on Feb. 13, 2020, as WO 2020/030222 A1 under PCT Article 21(2).

FIELD

The invention relates to a method for producing microstructures, in particular MEMS and MOEMS (microelectromechanical systems and microoptoelectromechanical systems) in a substrate having membrane-like, bridging or overhanging surfaces as a result of a material weakening caused by an etching process through material removal in order to produce a cut-out (cavity) in the substrate.

BACKGROUND

Such microstructures are already known, for example, as pressure sensing devices or microphones based on microelectromechanical systems (MEMS) of this type, wherein a bridging structure is created, which forms the basis for the micromechanical system as a membrane. A significant aspect is therefore a targeted material weakening, by means of which flexible surfaces are created.

The overhanging or bridging structures are therefore optimally suited for microphones or sensors. The method currently used in practice for the production of such structures is deep reactive ion etching (DRIE), which enables a controlled removal to reduce the layer thickness up to the desired residual thickness. This method is currently only usable in connection with silicon, which leads to high material costs.

For example, U.S. Pat. No. 4,236,137 A discloses a semiconductor pressure transducer. Further, U.S. Pat. Nos. 5,178,016 A and 6,093,579 A also disclose semiconductor pressure sensors.

DE 10 201 7216418 A1 relates to a pressure sensing device with an elongated flat polygonal cavity, in particular a pressure sensing device based on a micromechanical system (MEMS). This has a silicon carrier substrate, an elongated flat polygonal cavity formed in an upper surface of the silicon carrier substrate, an embedded silicon dioxide layer, a device layer formed on the silicon dioxide layer, and at least four bond pads formed and arranged on an upper surface of the device layer. The at least four bond pads are spaced from the elongated flat polygonal cavity. More specifically, the at least four bond pads are spaced from the elongated flat polygonal cavity so as not to be in connection with the elongated flat polygonal cavity. The pressure detection device may include a membrane arranged over the polygonal cavity, the shape of which is defined by the shape of the polygonal cavity and the size of which is essentially equal to the size of the polygonal cavity.

It is known that in MEMS pressure detection devices, pressure nonlinearity may occur due to deflection of a silicon membrane. However, the ability of a membrane to deflect also determines the ability of the MEMS pressure sensing device to detect pressure changes. As the membrane deflection increases, the output linearity also increases.

The pressure sensitivity of a MEMS pressure sensing device becomes more problematic as the membrane size decreases. Smaller membranes and smaller MEMS pressure sensing devices, however, enable a reduction in manufacturing costs for both the MEMS pressure sensing device itself and the housing in which the MEMS pressure sensing device is to be placed.

Microphones constructed from such microstructures are also known, which are constructed similarly to a pressure sensor and which convert the sound pressure into an electrical signal, while a leakage path ensures a static pressure equalization between volumes in front of and behind the microphones. They consist of at least one free-standing structure which is exposed to the environment and which moves in accordance with an acting sound pressure.

Movement of a diaphragm is detected by measuring a capacitance between the membrane and a perforated counter-electrode positioned in front of or behind the membrane.

An alternative known basic principle which allows detection of the movement of the free-standing structure is based on the direct piezoelectric effect. In such a microphone, a piezoelectric layer is influenced by the bending of a structure, whereupon an electrical charge is produced on its surface. This charge can be detected and evaluated as an electrical output voltage.

SUMMARY

In an embodiment, the present invention provides a method for producing a microstructure in a substrate with a membrane-like bridging or overhanging surface. The method includes modifying the substrate, which is made of glass, by laser radiation along a peripheral contour. A membrane layer is applied over a surface of the substrate for producing the bridging or overhanging surface, wherein, at least in partial surfaces enclosing the peripheral contour of the laser modifications, a sacrificial layer is disposed between the substrate and the membrane layer. A side of the substrate facing away from the membrane layer is exposed to an etching attack such that material is removed primarily along the peripheral contour until the sacrificial layer is reached and there is a disintegration or reduction of the sacrificial layer and a separation of a connection of a part of the substrate enclosed by the peripheral contour from the surrounding substrate and from the membrane layer.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
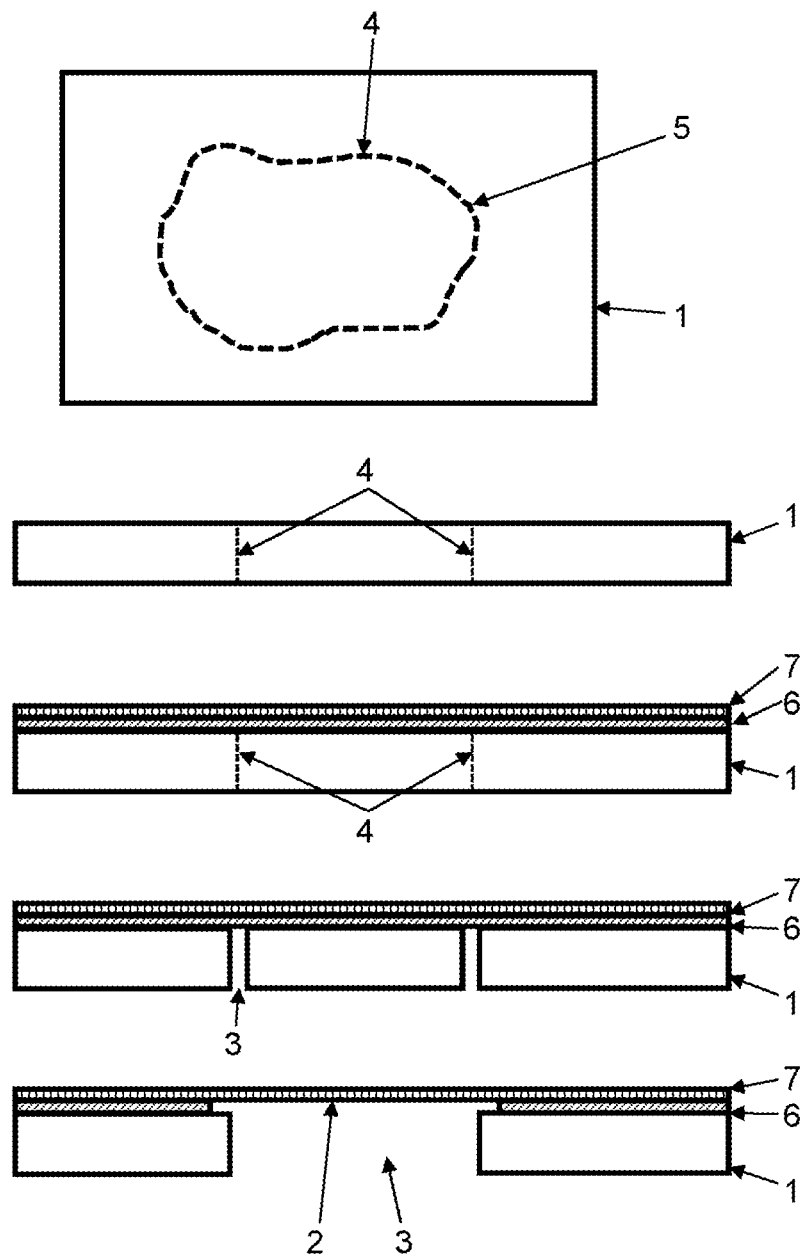
FIG. 1 individual method steps for producing overhanging structures along an annularly closed peripheral contour.

Laser-induced deep etching (LIDE) is a method for precision machining of glass. The LIDE method allows extremely precise holes and structures to be introduced at maximum speed and thus creates the prerequisites for the increased use of glass as a material in microsystems technology.

In an embodiment, the present invention provides a microstructure with which downsizing of the matrix type of a MEMS pressure detection device can be achieved while reducing the sensitivity and reducing the pressure non-linearities.

According to an embodiment of the present invention, the microstructures are produced in the glass substrate formed by a substrate made of glass, in that in a first step modifications by means of laser radiation are introduced into the glass substrate along a preferably annularly, not necessarily circularly closed peripheral contour and at least one membrane layer for producing the bridging or overhanging surfaces is applied over a surface onto the glass substrate, wherein at least in the partial areas enclosing the peripheral contour of the modifications a sacrificial layer is enclosed between the glass substrate and the membrane layer, wherein subsequently a side of the glass substrate facing away from the membrane layer is exposed to etching through which the removal of material primarily along the peripheral contour of the laser-modified regions occurs until the sacrificial layer is reached, so that there is a disintegration or reduction of the sacrificial layer through transverse etching and finally a separation of the connection of the contour of the glass substrate enclosed by the peripheral contour from the surrounding substrate as well as the membrane layer occurs.

It was surprisingly found in the present invention that the so-called pressure non-linearities could be significantly reduced by using a glass substrate instead of the silicon substrates used to date, which results on the one hand from the better material properties of the glass substrate in this respect and on the other hand from the significantly lower tolerance in the layer thickness of the membrane layer. In particular, according to embodiments of the present invention, only the glass substrate enclosing the sacrificial layer is removed, while the membrane layer remains unchanged, so that it is homogeneous over the entire application area. In other words, the material removal during the etching ends reliably when the sacrificial layer is reached, so that error influences during the performance of the method are reduced to a minimum. At the same time, the production costs due to the use of glass instead of silicon can be essentially reduced by the method according to embodiments of the present invention, wherein the considerably larger area of available glass substrates in relation to the silicon substrates limited in this respect also leads to a further cost advantage.

It has been found in accordance with an embodiment of the present invention that the sacrificial layer does not have to be completely disintegrated, but that the connection to the glass substrate and/or the membrane layer is weakened even after a brief etching attack such that the connection dissolves and the glass body enclosed by the peripheral contour detaches.

In a particularly advantageous embodiment of the invention, the method is carried out with the following method steps:

Introducing modifications by means of laser radiation along at least one preferably annularly closed peripheral contour into the glass substrate, Etching the glass substrate and thereby introducing at least one cut-out, for example as a groove-shaped depression, into the inner surface of the glass substrate, Applying a sacrificial layer to the glass substrate in a first region which encloses the cut-outs, Applying a membrane layer to the sacrificial layer in a second region which encloses the first region, wherein the second region is larger than the first region, Etching the glass substrate from a side of the glass substrate facing away from the membrane layer, as a result of which the material removal takes place at least essentially along the peripheral contour of the modifications of the laser-modified regions until the sacrificial layer is reached, so that a disintegration or reduction of the sacrificial layer and finally a separation of the connection of the contour of the glass substrate enclosed by the peripheral contour from the surrounding glass substrate and from the membrane layer occurs.

In this way, the first etching step can be used to introduce a contoured outer surface of the glass substrate, for example in the form of annular depressions, as a result of the etching attack, which then acts in a shaping manner for the membrane layer to be applied in the subsequent method sequence. The membrane layer is thus not limited to a planar course, but can, for example, have a corrugated shape which, comparable to a bellows, can serve as a tensile force-relieving structure. Likewise, diaphragms for loudspeakers or pressure sensors can also be produced in this way. Virtually any topography can thus be produced according to embodiments of the present invention.

In this case, it has already proven to be particularly advantageous if the modifications are introduced into the glass substrate along a plurality of annularly closed peripheral contours, wherein the peripheral contours preferably concentrically enclose each other.

Of course, in addition to circular peripheral contours and contours of any shape, polygonal peripheral contours can also be produced, wherein adjacent peripheral contours are in particular spaced parallel to one another, so that the distance to the adjacent peripheral contours is constant in the course of the peripheral contour.

The intensity of the laser radiation can be chosen to match different peripheral contours. However, it is particularly useful for many applications if the parameters of the laser radiation along a first peripheral contour deviate from the parameters of the laser radiation along a second peripheral contour enclosed by the first peripheral contour, so that, for example, the amplitude of the depressions decreases toward the center of the first region.

The etching attack can also be made inhomogeneous if, for example, only partial regions of the glass substrate are exposed to the etching attack by using masking.

The layer application can be carried out using various methods known per se on the surface of the glass substrate, wherein a sputtering method has already proven to be advantageous for the construction of the membrane layer or the sacrificial layer.

The peripheral contour can be introduced along a cylindrical or polygonal peripheral surface, wherein also those contours equipped with edges which could not be realized with the previous methods can be produced. In order to achieve a further particularly practical embodiment, the peripheral contour in a side facing the membrane layer may be configured differently from a side facing away from the membrane layer so as to achieve, for example, a conical or frustoconical course of the peripheral contour and the cut-out thus produced. In particular, a defined opening angle can thus be generated, which leads to a considerable advantage for many technical applications.

Although it has already proven to be advantageous in practical testing if the modifications are introduced into the glass substrate before the application of the sacrificial layer and the membrane layer, these can also be introduced subsequently in a modified process, that is to say, in the case of glass substrates prefabricated with sacrificial layer and membrane layer.

In this case, the sacrificial layer can be selectively applied to the glass substrate in a manner limited to the regions of the peripheral contour, in particular with an overlap to be determined in practice by testing. Of course, on the other hand, full-area application of the sacrificial layer can likewise be realized, wherein a subsequent removal of the intermediate regions is sensible in order to avoid complete separation of the glass substrate from the membrane layer.

In this case, it has already proven to be advantageous for the glass body enclosed by the peripheral contour to have at least one further modification incorporated within the peripheral contour for simplified detachment, and for the subsequent etching attack a channel-like cut-out is produced between an outer surface facing away from the membrane layer and the sacrificial layer. As a result, the separation is promoted in that a hydraulic pressure equalization is made possible by the fluid passage thus created. The number and nature of such compensation channels can be adapted accordingly to the respective application.

In a further modification of the method, which is likewise particularly practical, during the etching attack the glass substrate is set in high-frequency oscillation, in particular by means of ultrasound, in order thus to facilitate or accelerate the removal of the region of the glass substrate enclosed by the peripheral contour.

The method according to an embodiment of the present invention for producing microstructures in a substrate 1 with membrane-like, bridging or overhanging surfaces 2 will be explained in more detail below with reference to the individual method steps shown in FIG. 1. The overhanging surfaces 2 arise as a result of material weakening brought about by an etching process and as a result of material removal for producing a cut-out 3 in the substrate. For this purpose, in a first method step, modifications 4 are introduced into the glass substrate 1 by means of laser radiation along an annularly closed peripheral contour 5, as can be seen in a top view of the substrate 1. In a first step, a sacrificial layer 6 not resistant to a wet-chemical etching bath is applied to the substrate 1 modified in such a way, and a membrane layer 7 resistant to the etching medium, for example a metal layer, is applied to the sacrificial layer.

An etching attack is primarily carried out on a side of the substrate 1 facing away from the membrane layer 7 by an etching medium which is not shown. In this case, the etching attack leads to a linear, groove-shaped removal of the substrate material along the peripheral contour 5, wherein the etching progress takes place at least essentially perpendicular to the surface of the substrate 1. In the event of a progressive removal and correspondingly recessed groove-shaped material removal, the sacrificial layer 6 is reached. Due to the etching effect, this disintegrates not only in accordance with the peripheral contour 5, but also in the transverse direction thereto. The region enclosed by the peripheral contour 5 thereby loses the adhesion or bonding thereto and can be removed from the substrate through the downward force of gravity. The desired overhang contour 5, which can be used, for example, as a membrane, thus spans the cut-out 3.

Figure 2:
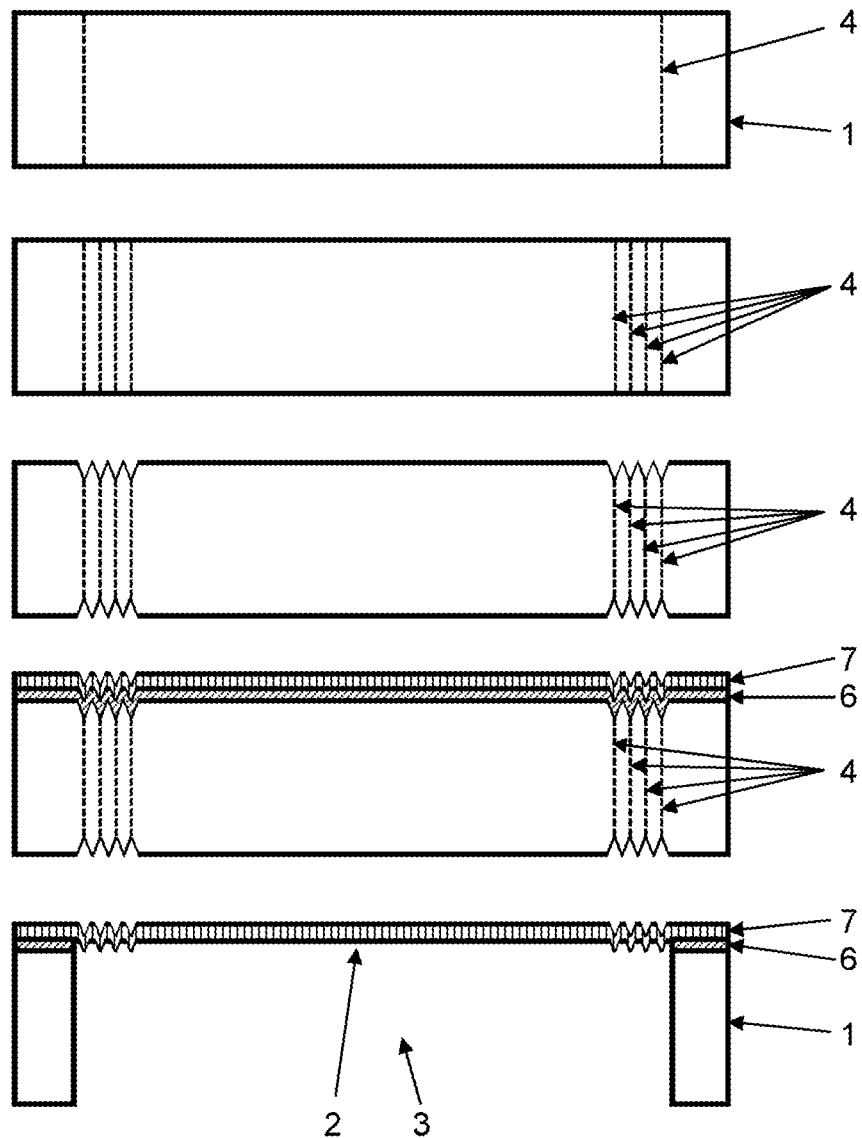
FIG. 2 the method steps shown in FIG. 1 for producing a plurality of annular closed peripheral contours which enclose one another.
Figure 3:
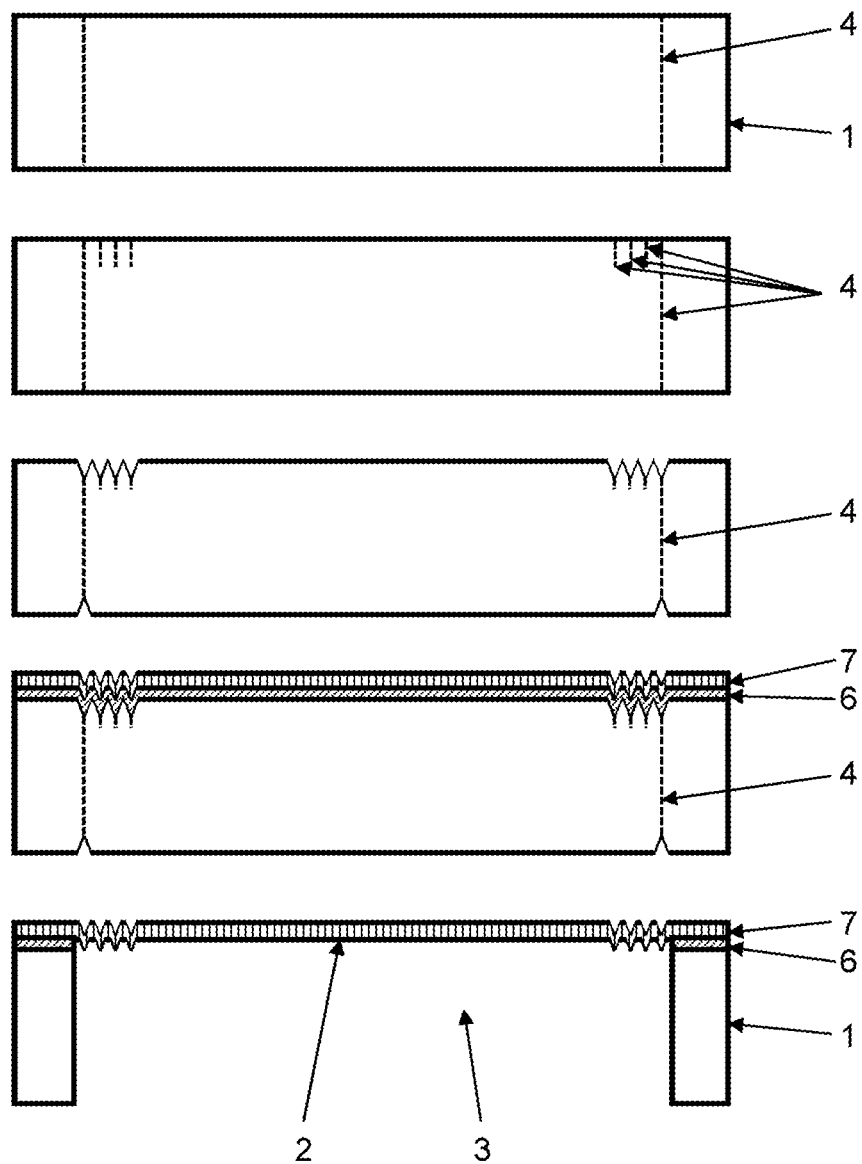
FIG. 3 a variant of the method shown in FIG. 2 with a plurality of peripheral contours introduced only on one side.

In addition, variants of the method are shown in FIGS. 2 and 3, which differ from the method shown in FIG. 1 by a plurality of peripheral contours 5 which, for example, concentrically enclose one another in conjunction with an additional etching step before the application of the sacrificial layer 6 and the membrane layer 7.

For this purpose, the different peripheral contours 5 need not be arranged at a uniform distance from one another. For example, adjacent peripheral contours 5 could also intersect. The enclosed peripheral contours 5 likewise do not have to be closed in an annular manner, but can also be introduced into the substrate 1 in a manner limited to a surface section. After the laser modification has been completed along the various peripheral contours 5, first a first etching attack takes place in an etching bath, as a result of which, in the region of the peripheral contours 5, a material removal as a groove-shaped cut-out 3 is introduced into the substrate surface depending on the modification with matching or different depth. In the sacrificial layer 6 and the membrane layer 7 applied thereto in the next step according to the method step shown in FIG. 1, the uneven contour is correspondingly formed. The subsequent etching of a side of the substrate 1 facing away from the membrane layer 7 leads to a linear removal of the substrate material along all peripheral contours 5, so that the region enclosed by the peripheral contour 5 is removed from the substrate 1. In addition to planar regions, the surface 2 thus also has wavy regions which are contoured on the edge and can serve, for example, as length compensation in the sense of a bellows. In particular, the overhang contour thereby obtains flexible or elastic properties in portions, which open up completely new possibilities for use.

In the method shown in FIG. 3, the result corresponds to the method shown in FIG. 2. In this variant, the enclosed peripheral contours 5 used for forming the contour of the membrane layer 7 do not extend over the entire material thickness of the substrate 1, but are essentially limited to a region close to the surface of the correspondingly contoured membrane layer 7 to be applied. Such modifications 4 having a lower penetration depth are generated, for example, by modified laser parameters. The removal of the region of the substrate 1 enclosed by the peripheral contour 5 in question can take place in a single piece, as in the variant shown in FIG. 1.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SYMBOLS

1 Substrate
2 Surface
3 Cut-out
4 Modification
5 Peripheral contour
6 Sacrificial layer
7 Membrane layer

The invention claimed is:

1. A method for producing microstructures in a substrate with membranous, bridging or overhanging surfaces as a result of a material weakening caused by an etching method through a material removal to produce a cut-out in the substrate, characterized in that the microstructures in the glass substrate made of glass, in particular quartz glass, are formed, in that in a first step modifications by means of laser radiation along a preferably annularly closed peripheral contour are introduced into the substrate; and
   at least one membrane layer for producing the bridging or overhanging surfaces on the substrate is applied over a surface, wherein, at least in the partial surfaces enclosing the peripheral contour of the laser modifications, a sacrificial layer between the substrate and the at least one membrane layer is enclosed, wherein subsequently a side of the substrate facing away from the at least one membrane layer to an etching attack, by means of which the removal of material primarily along the peripheral contour of the laser-modified areas occurs until the sacrificial layer is reached, so that there is a disintegration or reduction of the sacrificial layer and finally a separation of the connection of the contour enclosed by the peripheral contour of the substrate from the surrounding substrate as well-as the at least one membrane layer occurs.

2. The method according to claim 1, wherein the etching attack is limited to partial regions of the peripheral contour by using masking.

3. The method according to claim 1, wherein the peripheral contour is introduced along a cylindrical or polygonal peripheral surface.

4. The method according to claim 1, wherein the peripheral contour is introduced in a side facing the at least one membrane layer in a manner differing from a peripheral contour on a side facing away from the at least one membrane layer.

5. The method according to claim 1, wherein the modifications are introduced into the glass substrate before the sacrificial layer and the at least one membrane layer are applied.

6. The method according to claim 1, wherein at least one further modification is introduced into the substrate within the peripheral contour.

7. The method according to claim 1, wherein, during the etching attack, the glass substrate is set in high-frequency oscillation by means of ultrasound.

8. The method according to claim 1, wherein the peripheral contour is annular.

9. The method according to claim 1, wherein the at least one membrane layer is resistant to an etching medium used in the etching attack and the sacrificial layer is not resistant to the etching medium.

10. A method for the production of microstructures in a glass substrate, in particular of quartz glass, with membrane-like, bridging or overhanging surfaces as a result of material weakening caused by an etching process through material removal to produce at least one cut-out in the glass substrate, the method comprising:
   introducing modifications by laser radiation along at least one preferably annular peripheral closed contour into the glass substrate;
   applying a sacrificial layer to the glass substrate in a first region which has the peripheral contour of the modifications;
   applying a membrane layer to the sacrificial layer in a second region which encloses the first region; and
   etching the glass substrate from a side of the glass substrate facing away from the membrane layer such that material removal occurs at least essentially along the peripheral contour of the modifications of the laser-modified regions until the sacrificial layer is reached, so that the sacrificial layer is dissolved or reduced and a separation of a connection of the contour of the glass substrate enclosed by the peripheral contour from the surrounding glass substrate and from the membrane layer occurs.

11. The method according to claim 10, wherein after the introduction of the modifications into the glass substrate by means of laser radiation at least an outer area of the glass substrate is exposed to an etching attack and thereby a cut-out is introduced, and that subsequently one after another the sacrificial layer is applied in the first region and the membrane layer in the second region is applied at least to the outer surface of the glass substrate furnished with the cut-out and subsequently the outer surface of the glass substrate facing away from the membrane layer is subjected to a renewed etching attack until the connection of the contour of the glass substrate enclosed by the peripheral contour is separated from the surrounding glass substrate and from the membrane layer.

12. The method according to claim 10, wherein the modifications are introduced into the glass substrate along a plurality of annularly closed peripheral contours, wherein the peripheral contours enclose one another.

13. The method according to claim 10, wherein adjacent peripheral contours are introduced into the glass substrate in parallel to one another.

14. The method according to claim 12, wherein parameters of the laser radiation along a first peripheral contour deviate from parameters of the laser radiation along a second peripheral contour enclosed by the first peripheral contour.

15. The method according to claim 10, wherein the membrane layer and/or the sacrificial layer are applied by a sputtering method.

16. The method according to claim 12, wherein firstly a full-area application of the sacrificial layer and subsequently a removal of the sacrificial layer is carried out in intermediate regions between the peripheral contours.

* * * * *